United States Patent [19]

Saylor

[11] Patent Number: 5,895,998
[45] Date of Patent: Apr. 20, 1999

[54] PIEZOELECTRIC DRIVE CIRCUIT

[75] Inventor: Richard Saylor, Lake Hopatcong, N.J.

[73] Assignee: Raytheon Company, Lexington, Mass.

[21] Appl. No.: 08/933,069

[22] Filed: Sep. 18, 1997

[51] Int. Cl.$^6$ .................................................. H01L 41/08
[52] U.S. Cl. .................................. 310/316; 310/317
[58] Field of Search .................... 310/316, 317; 318/116

[56] References Cited

U.S. PATENT DOCUMENTS

| | | | |
|---|---|---|---|
| 4,644,212 | 2/1987 | Moritugu et al. | 310/317 |
| 4,688,536 | 8/1987 | Mitsuyasu et al. | 310/317 X |
| 4,767,959 | 8/1988 | Sakakibara et al. | 310/317 |
| 4,866,326 | 9/1989 | Niikawa et al. | 310/317 X |
| 4,947,074 | 8/1990 | Suzuki | 310/316 |
| 5,095,256 | 3/1992 | Ueyama et al. | 310/316 X |
| 5,130,598 | 7/1992 | Verheyen et al. | 310/316 |
| 5,204,576 | 4/1993 | Mitsuyasu | 310/317 |
| 5,208,505 | 5/1993 | Mitsuyasu | 310/317 |
| 5,350,962 | 9/1994 | Sakaida et al. | 310/316 |
| 5,361,013 | 11/1994 | Wiget | 310/316 |
| 5,361,014 | 11/1994 | Antone et al. | 310/316 |
| 5,425,343 | 6/1995 | Akai et al. | 310/317 X |
| 5,477,831 | 12/1995 | Akaki et al. | 310/316 X |
| 5,479,062 | 12/1995 | Yoshino | 310/316 |
| 5,512,856 | 4/1996 | Doak | 310/317 X |
| 5,543,679 | 8/1996 | Morino et al. | 310/316 |
| 5,691,592 | 11/1997 | Gunderson et al. | 310/317 |

*Primary Examiner*—Mark O. Budd
*Attorney, Agent, or Firm*—W. C. Schubert; G. H. Lenzen, Jr.

[57] ABSTRACT

A drive circuit (18) is provided that utilizes a power supply (30) to generate an output voltage that effects a precise displacement in a physical device. The drive circuit (18) includes storage circuitry (26) having a capacitive load (54) for storing the output voltage, a supply switch (34) connected the to the storage circuitry (26), the power supply (30), and control circuitry (22) that controls the supply switch (34) in response to an input signal. The control circuitry (22) controls the supply switch (34) in response to the input signal such that a supply voltage (31) from the power supply (30) is intermittently applied to the capacitive load (54) of the storage circuit (26) for generation of the output voltage that is used to effect a precise displacement in a physical device.

16 Claims, 6 Drawing Sheets

PIEZOELECTRIC DRIVE CIRCUIT

BACKGROUND OF THE INVENTION

1. Field of the Invention

The present invention relates generally to devices which control the charge stored at a capacitive load by controlling the application of a supply voltage to the load and, more particularly, to a minimum power piezoelectric actuator circuit that quickly and efficiently charges an actuator output voltage in response to an input signal.

2. Discussion of Related Art

Piezoelectric actuators are often used to effect small, but well-controlled displacements of physical objects, such as optical components and machining tools. These mechanical displacements must be very precise and controlled, and are typically on the order of 1-100 microns. In operation, the actuator functions based on an applied voltage. The actuator itself is a capacitor used to store a potential which drives the mechanical displacement. Since capacitors draw no DC current, the theoretical power necessary for actuator operation is very low.

Despite the low power requirements of the actuator, the conventional circuits used to drive piezoelectric actuators unnecessarily dissipate significant power in a number of ways. First, the conventional systems often use power supplies having a voltage higher than is necessary to charge the actuator. These high-voltage power supplies are often separate from other subsystems and dedicated specifically to driving the piezoelectric actuator, resulting in waste and increased manufacturing costs. The conventional piezoelectric actuator systems also typically use resistive elements in portions of the system with significant current flows, thereby causing unnecessary dissipation of power. Furthermore, the conventional circuits used to drive piezoelectric actuators often draw current even when it is not needed to charge the actuator.

In addition to being very precise and accurate, the mechanical displacements effected by a piezoelectric actuator must be well-controlled in the sense that they are properly timed. A piezoelectric actuator must therefore be able to respond quickly to an input drive signal used to control the charging of the actuator. However, many conventional load charging circuits are unable to provide the fast response times required for piezoelectric actuation.

In view of the foregoing, it is an object of the present invention to provide a piezoelectric drive circuit that quickly responds to an input signal and that employs a low voltage power supply and low impedance and reactive components to avoid unnecessary power dissipation. Power is also conserved by drawing current only when necessary to charge the piezoelectric actuator. It is also an object of the present invention that these power saving advantages allow a piezoelectric drive circuit as taught herein to be incorporated into small, portable devices which run on battery power.

SUMMARY OF THE INVENTION

The present invention provides a drive circuit that utilizes a power supply to generate an output voltage that effects a precise displacement in a physical device. The drive circuit includes storage circuitry having a capacitive load for storing the output voltage, a supply switch connected to the storage circuitry, the power supply, and control circuitry that controls the supply switch in response to an input signal. The control circuitry controls the supply switch in response to the input signal such that a supply voltage from the power supply is intermittently applied to the capacitive load of the storage circuit for generation of the output voltage that is used to effect a precise displacement in a physical device.

BRIEF DESCRIPTION OF THE DRAWINGS

Other objects and advantages of the invention will become apparent to those skilled in the art upon reading the following detailed description and upon reference to the following drawings in which.

DETAILED DESCRIPTION OF THE PREFERRED EMBODIMENT

Figure 1:
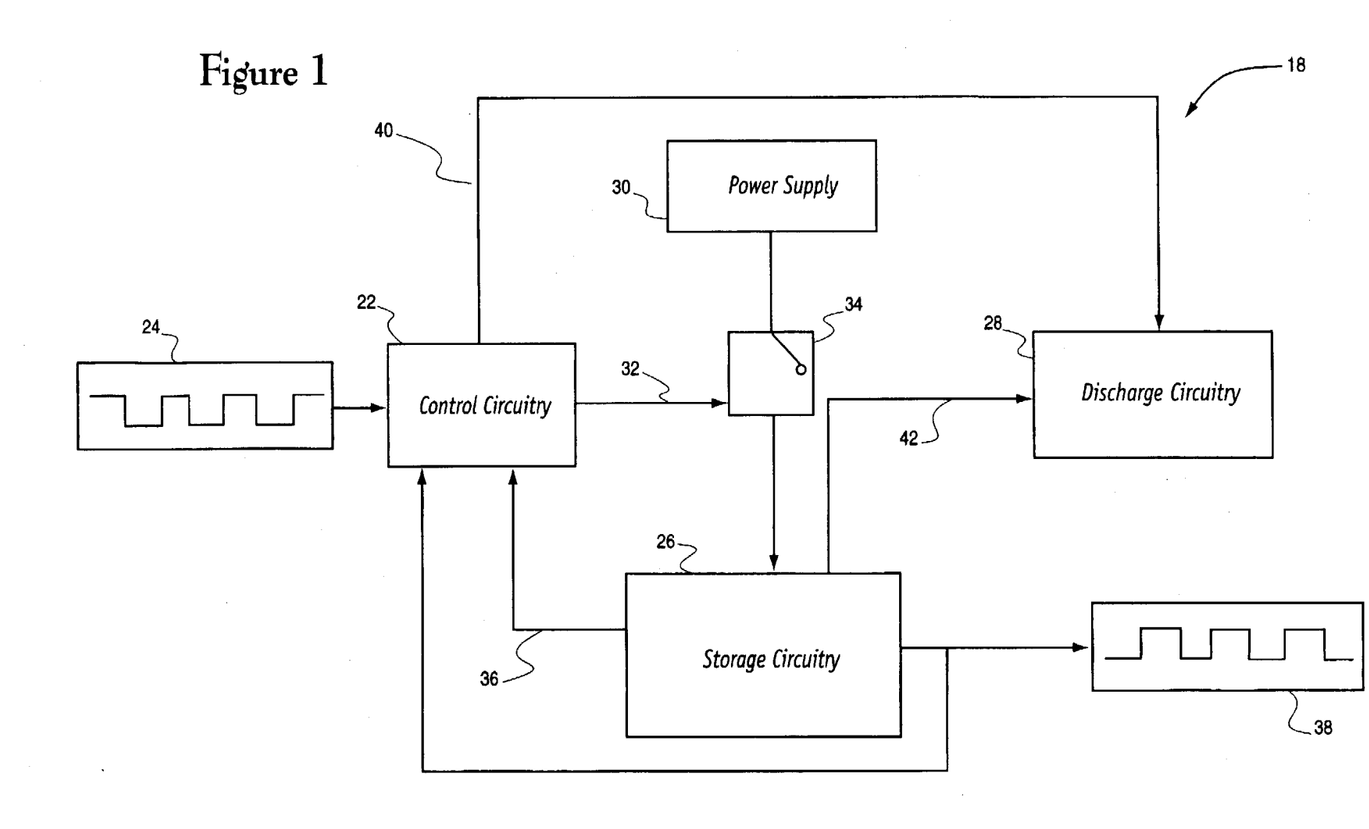
FIG. 1 is a block diagram of the piezoelectric drive circuit of the present invention.

FIG. 1 shows a block diagram of a piezoelectric drive circuit 18 according to the preferred embodiment of the present invention. Control circuitry 22 receives an input drive signal 24. The control circuitry 22 is electrically connected to storage circuitry 26 and discharge circuitry 28. A power supply 30 is caused to selectively apply a supply voltage to storage circuitry 26 in response to a power supply control signal 32 generated by the control circuitry 22. The supply voltage is delivered through a power supply switch 34 to the storage circuitry 26. The control circuitry 22 is operable to read values of an instantaneous voltage 36 and an output drive signal 38 supplied from the storage circuitry 26. The control circuitry 22 also supplies a discharge control signal 40 to the discharge circuitry 28 in order to control the impedance of the discharge path 42 utilized by the storage circuitry 26.

The drive circuit 18 operates to control the value of an output voltage stored within the storage circuitry 26 which includes a capacitive load (i.e. piezoelectric actuator), that is used to effect a small, well-controlled mechanical displacement of a physical device (not shown). This mechanical displacement is a function of the value of the input drive signal 24. The value of the stored voltage is incrementally increased in stepwise fashion by selective application of a supply voltage from the power supply 30 through the power supply switch 34 to the storage circuitry 26. When the desired mechanical displacement has been accomplished, the discharge control signal 40 and the discharge circuitry 28 operate collectively to allow the stored voltage to discharge through discharge path 42. When the input drive signal 24 goes positive, or its magnitude exceeds a threshold level, the power supply control signal 32 closes the power supply switch 34 so that supply voltage is delivered from the power supply 30 to the storage circuitry 26 in order to charge the output voltage. The charging process involves generating a current within the storage circuitry 26. The instantaneous voltage 36, which is sampled by the control circuitry 22, corresponds to this generated current. When the instantaneous voltage 36 exceeds a predetermined level, the control circuitry 22 causes the power supply control signal 32 to terminate the application of the supply voltage from the power supply 30 to the storage circuitry 26. The instantaneous voltage 36 and its corresponding current then begin to decrease upon termination of the supply voltage. Once the instantaneous voltage 36 has fallen below a predetermined level, the control circuitry 22 causes the power supply control signal 32 to close the power supply switch 34 in order to re-supply voltage from the power supply 30 to the storage circuitry 26.

This intermittent application of supply voltage to the storage circuitry 26 causes the output voltage to be charged in stepwise fashion with a low voltage power supply, where low voltage means a voltage that is less than the output voltage to be generated (i.e. low relative to the generated output voltage). For example, in modern systems that use a 3 to 5 volt power supply for both analog and digital circuits, the present invention provides for controlled voltages or waveforms greater than 5 volts, with the capability to produce output voltages of more than 100 volts.

This incremental charging allows the low voltage power supply to charge the output voltage to a value much higher than would be obtained if the supply voltage were only applied to the storage circuitry once. The increase in the value of the stored output voltage per individual application of supply voltage is limited by the components used in the storage circuitry and by the value of the supply voltage. Repeated application of supply voltage to the storage circuitry overcomes this limitation and allows the output voltage to be charged to a high value.

The output voltage is charged in this incremental fashion until the value of the output drive signal 38 has exceeded a threshold value. The control circuitry 22 sets this threshold value by generating a scaled reference value proportional to the level of the input drive signal 24. Thus, the output drive signal 38 proportionally tracks the input drive signal 24.

To summarize the charging process, the control circuitry 22 continuously samples and processes the values of the input drive signal 24, the output drive signal 38, and the instantaneous voltage 36 in order to generate the power supply control signal 32 and thereby control the charging of the output voltage.

The piezoelectric drive circuit also responds to the input drive signal 24 in order to control the discharge of the output voltage. While the magnitude of the input drive signal 24 is non-decreasing, the control circuitry 22 generates the discharge control signal 40 in order to prevent the discharge of the output voltage through the discharge path 42. Once the magnitude of the drive signal 24 decreases and goes to zero, this signifies that the mechanical displacement is no longer desired. To accomplish this, the control circuitry 22 causes the discharge control signal 40 and discharge circuitry 28 to enable the discharge path 42 so that the output voltage is discharged to ground.

Figure 2:
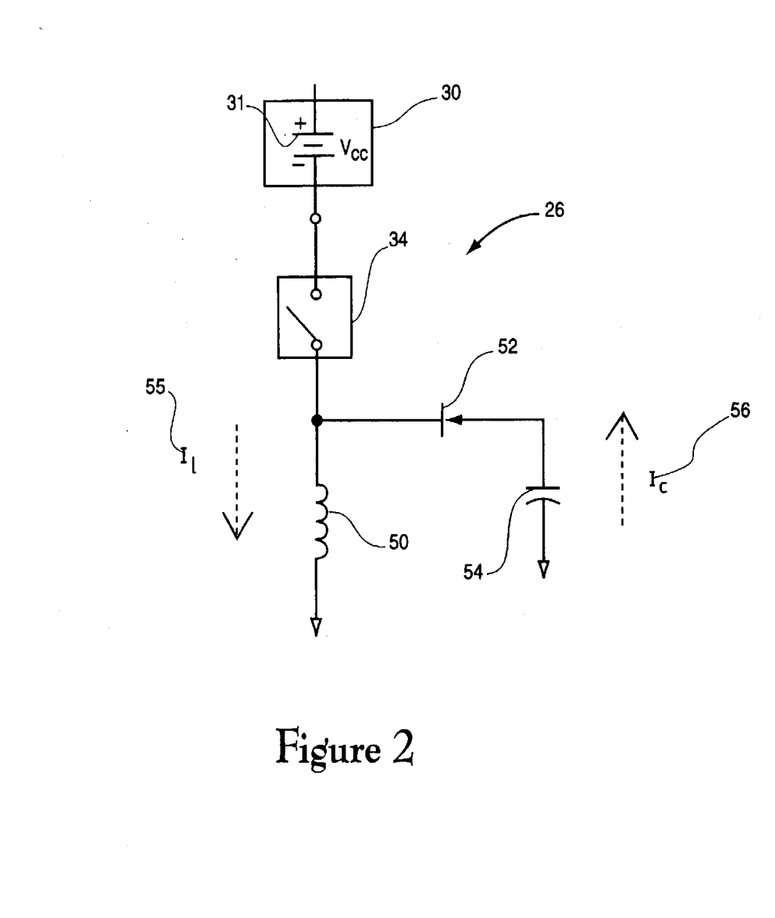
FIG. 2 is a more detailed schematic diagram of the storage circuitry of the piezoelectric drive circuit.

FIG. 2 shows the storage circuitry 26 in further detail. The storage circuitry 26 includes an inductor 50, a diode 52, and an actuator capacitance 54 connected in series. The inductor 50 is intermittently supplied with the supply voltage ($V_{cc}$) 31 from the power supply 30 by operation of the power supply switch 34. When the switch 34 is closed, $V_{cc}$ 31 is connected to the inductor 50, generating a current ($I_L$) 55 through the inductor 50 that varies with time. The current ($I_L$) 55 through the inductor 50 increases at a constant rate determined by the value of the supply voltage 31 and the value of the inductor 50. When the current through the inductor 50 reaches a predetermined limit, control circuits (not shown) open the power supply switch 34, cutting off the application of supply voltage 31 to the storage circuitry 26. Upon opening of the power supply switch 34, the value of the current ($I_L$) 55 does not change instantaneously, but since the power supply switch 34 is open, the only available path for the current ($I_L$) 55 is through the diode 52 and into the actuator capacitance 54. The flow of current ($I_C$) 56 through the actuator capacitance 54 causes the actuator voltage to be charged to a negative value. When the current through the inductor ($I_L$) 55 drops to near zero, the control circuit closes the power supply switch 34 to re-supply voltage to the storage circuitry 26, and the cycle repeats.

Figure 3:
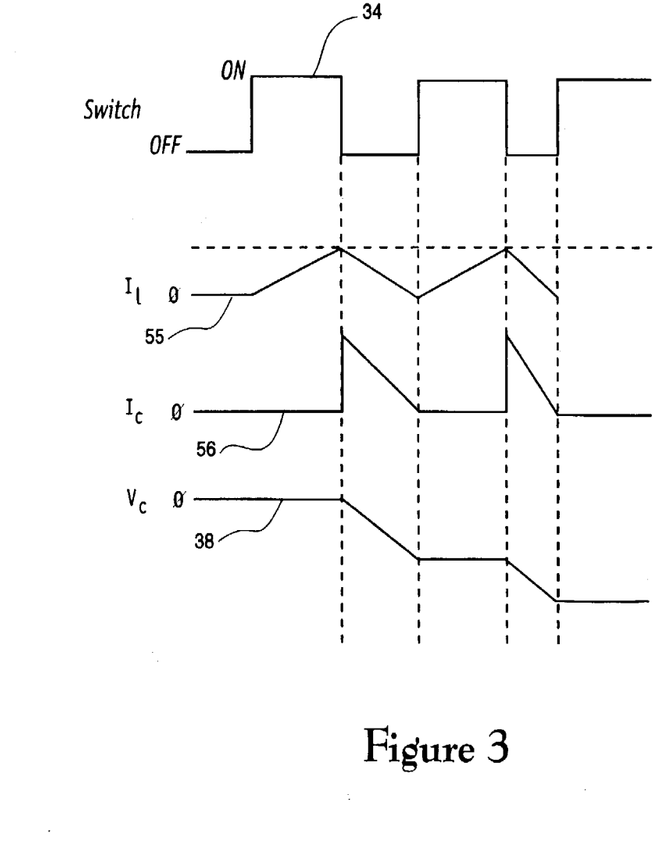
FIG. 3 is a diagram of the switch state, voltage and current waveforms of the storage circuitry depicted in FIG. 2.

When the power supply switch 34 is closed, the diode 52 prevents current flow to the actuator capacitance 54. Each subsequent cycle increases the negative voltage across the actuator capacitance 54, and theoretically, the voltage could rise indefinitely. The practical limitation is that as the actuator voltage increases across the actuator capacitance 54, the charging time decreases. Eventually, the charging time becomes less than the switching time of the control circuits, and the process levels out. The waveform diagram of FIG. 3 depicts the state of the power supply switch 34, the currents through the inductor 50 and actuator capacitance 54, and the resulting voltage across the actuator capacitance 54.

Figure 4:
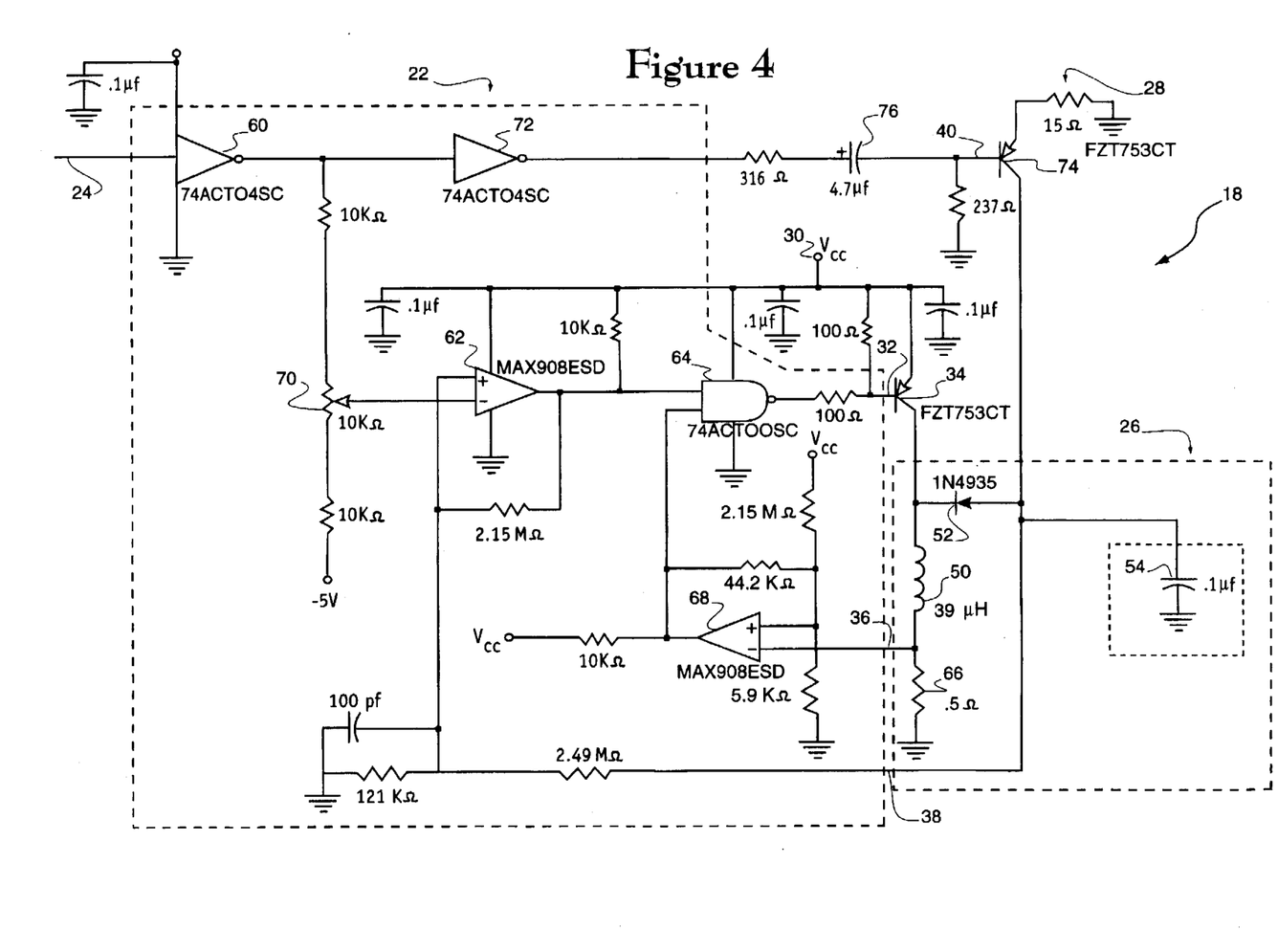
FIG. 4 is a circuit diagram of the piezoelectric drive circuit in greater detail.
Figure 5:
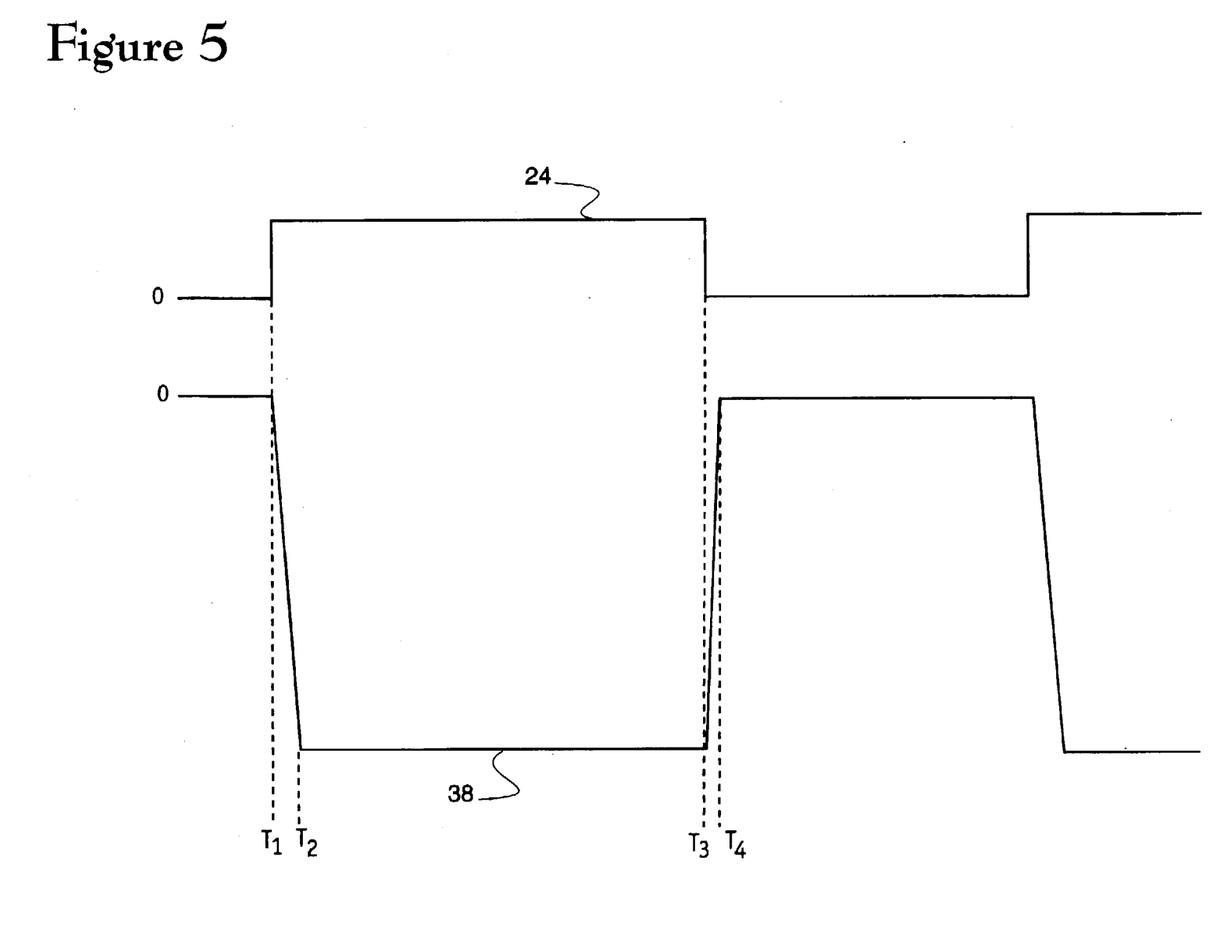
FIG. 5 is a waveform diagram illustrating waveforms applied to, and emerging from, the piezoelectric drive circuit.

FIG. 4 shows a circuit diagram of a preferred embodiment of the piezoelectric drive circuit 18. FIG. 5 shows the input drive waveform applied to the circuit and the resulting piezoelectric actuator output voltage. Referring to FIG. 4, when the input drive waveform 24 goes positive at time $T_1$ (shown in FIG. 5), the output of the inverter 60 drops to zero and the output of the comparator 62 rises to ($V_{cc}$) (+3.3 V), supplying a logic HI to the NAND gate 64. The output of the NAND gate 64 then drops (the other input is initially set to logic HI) and turns on the power supply switch 34, a transistor. The signal that controls the power supply switch 34 is the previously described supply control signal 32. The transistor then saturates and applies $V_{cc}$ from the power supply 30 to the inductor 50. The current through the inductor 50 then rises at a linear rate, causing an increasing voltage drop across the current-sampling resistor 66. When the voltage across the current-sampling resistor 66 rises above a predetermined maximum value supplied to the positive terminal of the comparator 68, the output of the comparator 68 drops to near zero. This output is then supplied to the NAND gate 64, forcing its output high in order to cut off the transistor 34 and terminate the supply of voltage from power supply 30. The current that has been generated through the inductor 50 is then forced to flow through the diode 52 and the actuator capacitance 54, the only remaining path for current flow. This causes the actuator voltage to be charged to an increased negative value.

As the current through the inductor decreases after the termination of the supply voltage, the voltage across the current-sampling resistor 66 drops. As this voltage approaches zero, or falls below a predetermined minimum value, the output of the comparator 68 rises, causing the output of the NAND gate 64 to go low once again. This causes voltage from the power supply 30 to be re-applied to the inductor 50 through the power supply switch 34. This process repeats during the time interval between $T_1$ and $T_2$ (FIG. 5), such that the actuator voltage stored across the actuator capacitance 54 is charged in the stepwise fashion depicted in the waveform diagram of FIG. 3. In other words, while supply voltage is delivered to the inductor 50, the voltage on the actuator capacitance 54 holds its value and then steps to a more negative value each time the power supply switch 34 terminates the supply voltage to the inductor.

While the output actuator voltage stored at the actuator capacitance 54 is being charged, the control circuitry 22 is continuously sampling the value of the actuator voltage stored at the actuator capacitance 54 via the output drive signal 38 (see FIG. 1). The comparator 62 compares the value of the actuator voltage stored across the actuator capacitance 54 with a reference value supplied to the negative terminal of the comparator 62. This reference value is established by supplying the inverted waveform of the input drive signal 24 to the potentiometer 70. When the sampled value of the actuator voltage falls to the proportional value established by the potentiometer 70, the output of the comparator 62 drops, causing the NAND gate 64 to deliver a power supply control signal 32 to the power supply switch 34 which terminates any further supply of voltage from the power supply 30 to the inductor 50. Thus, once the actuator voltage has risen to the desired reference level, the control circuitry 22 prevents any further charging of the actuator voltage.

The logic used to control the charging of the actuator voltage may therefore be summarized as follows: if either the output of comparator 62 goes low (corresponding to no input drive signal or a fully charged actuator voltage), or if the output of the comparator 68 goes low (corresponding to the inductor current exceeding the predetermined threshold value), then the NAND gate 64 and the power supply switch 34 operate collectively to prevent further charging of the actuator voltage. Otherwise, supply voltage is applied to the storage circuitry 26 in order to step the actuator voltage to a more negative value.

As previously described, the control circuitry 22 also controls the discharge of the actuator voltage stored across the actuator capacitance 54. During the time after $T_1$ when the input drive signal has gone positive, the inverter 72 provides a high level to the base of the transistor 74, holding that transistor in a cut-off condition. This cut-off condition is maintained during the time intervals from $T_1$ to $T_2$, and $T_2$ to $T_3$, such that the output voltage stored across the actuator capacitance 54 has no discharge path of low impedance. The output voltage stored across the actuator capacitance 54 is therefore held essentially constant as shown in FIG. 5.

At time $T_3$, the input waveform drops to zero. This changes the reference voltage supplied to the negative terminal of the comparator 62, causing the output of the comparator 62 to go low, which in turn causes the power supply switch 34 to terminate the supply of supply voltage to the inductor 50 for the remainder of the cycle. Also at $T_3$, a negative level is coupled to the transistor 74 through the capacitor 76. This causes the transistor 74 to turn on, providing a discharge path for the output voltage stored at the actuator capacitance 54. The effect of the capacitive coupling is to provide a high initial base current to the transistor 74 so that the actuator voltage discharges quickly. During the time after $T_4$, as the capacitor 76 discharges, the base current is reduced to conserve power. The base current to the transistor is no longer required because once the actuator is discharged, no further current from the transistor 74 is required to hold the actuator voltage to zero.

It should be readily understood that, although the preferred embodiment has been described with reference to a positive-going input drive signal, the configuration of the piezoelectric drive circuit could readily be modified to accommodate other types of signals.

Figure 6:
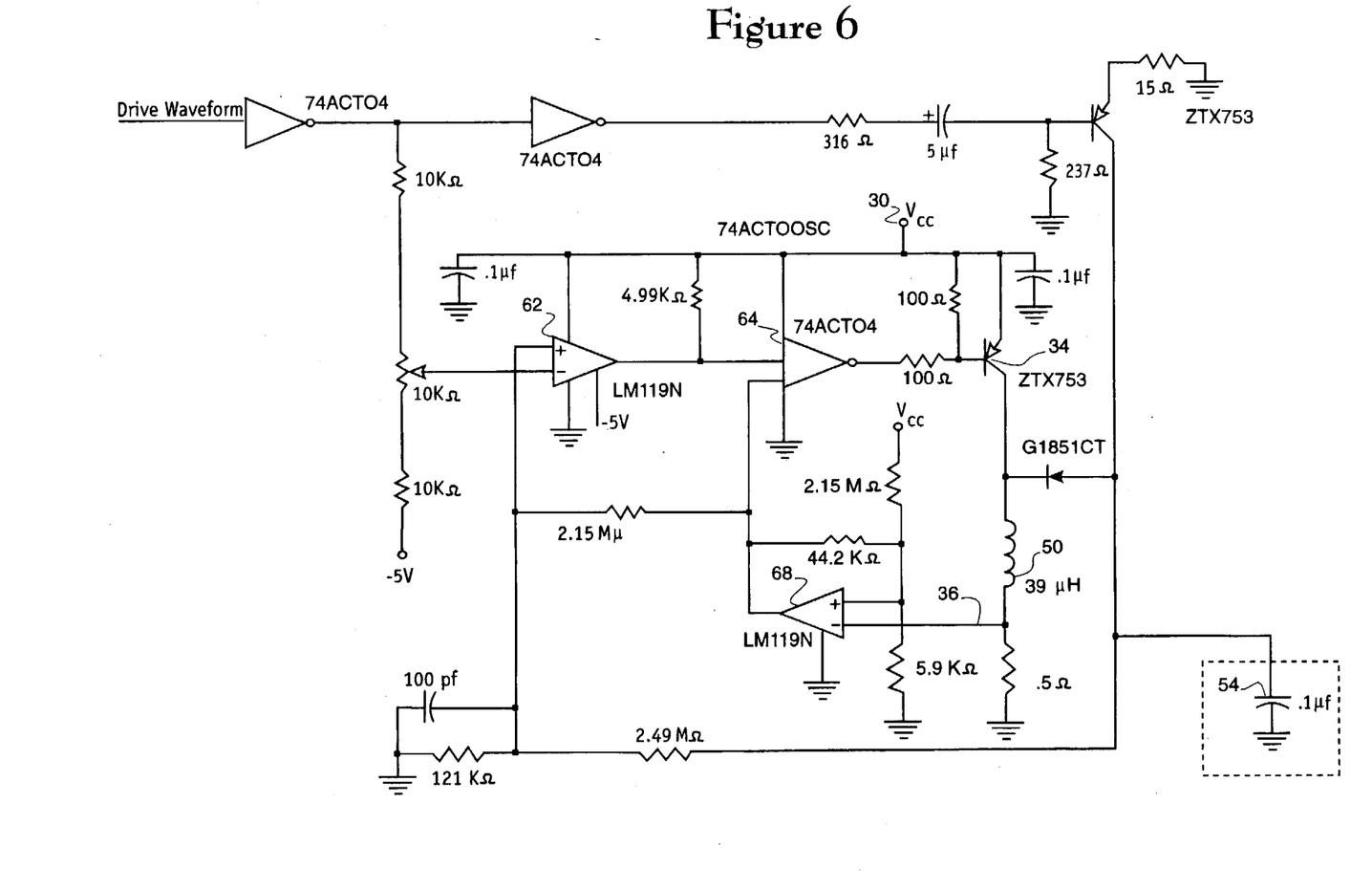
FIG. 6 is a circuit diagram of an alternative embodiment of the piezoelectric drive circuit.

FIG. 6 provides a circuit schematic of an alternate implementation of the piezoelectric drive circuit. The basic principles of operation are the same as that of the circuit depicted in the FIG. 4. This circuit achieves the NAND logic described with reference to FIG. 4 by using comparators 62 and 68 in conjunction with an inverter 77. The comparators 62 and 68 are of open-collector configurations, such that if either output goes low, the inverter 77 and the power supply switch 34 operate collectively to cut off the supply voltage from the power supply 30 to the inductor 50, thereby preventing further charging of the output voltage stored across the actuator capacitance 54. In addition to this difference in configuration, the piezoelectric drive circuit described with reference to FIG. 4 features all surface mount components and uses integrated circuits that consume less power than the circuit described with reference to FIG. 6. The circuit of FIG. 4 therefore represents the preferred embodiment of the present invention.

The descriptions made with reference to FIGS. 4 and 6 reveal that significant current is drawn by the piezoelectric drive circuit only during the time from $T_1$ to $T_2$ and during the time from $T_3$ to $T_4$ (see FIG. 4). Furthermore, during the discharge time from $T_3$ to $T_4$, the current that is drawn is driven by the stored actuator voltage, not by the power supply 30. Significant current from the power supply 30 is therefore drawn only during the time interval from $T_1$ to $T_2$. It should also be readily apparent that these circuits allow the output voltage to be charged with a small power supply which may be already available in the system. This small power supply may be used to charge the output voltage to voltage levels beyond that of the power supply itself, due to the cyclical/intermittent charging of the actuator voltage, and the ability of the actuator to hold its charge during non-charging intervals. In addition, the portions of these circuits where significant current flows contain primarily reactive components, thereby avoiding the significant power losses associated with resistive components.

Figure 7:
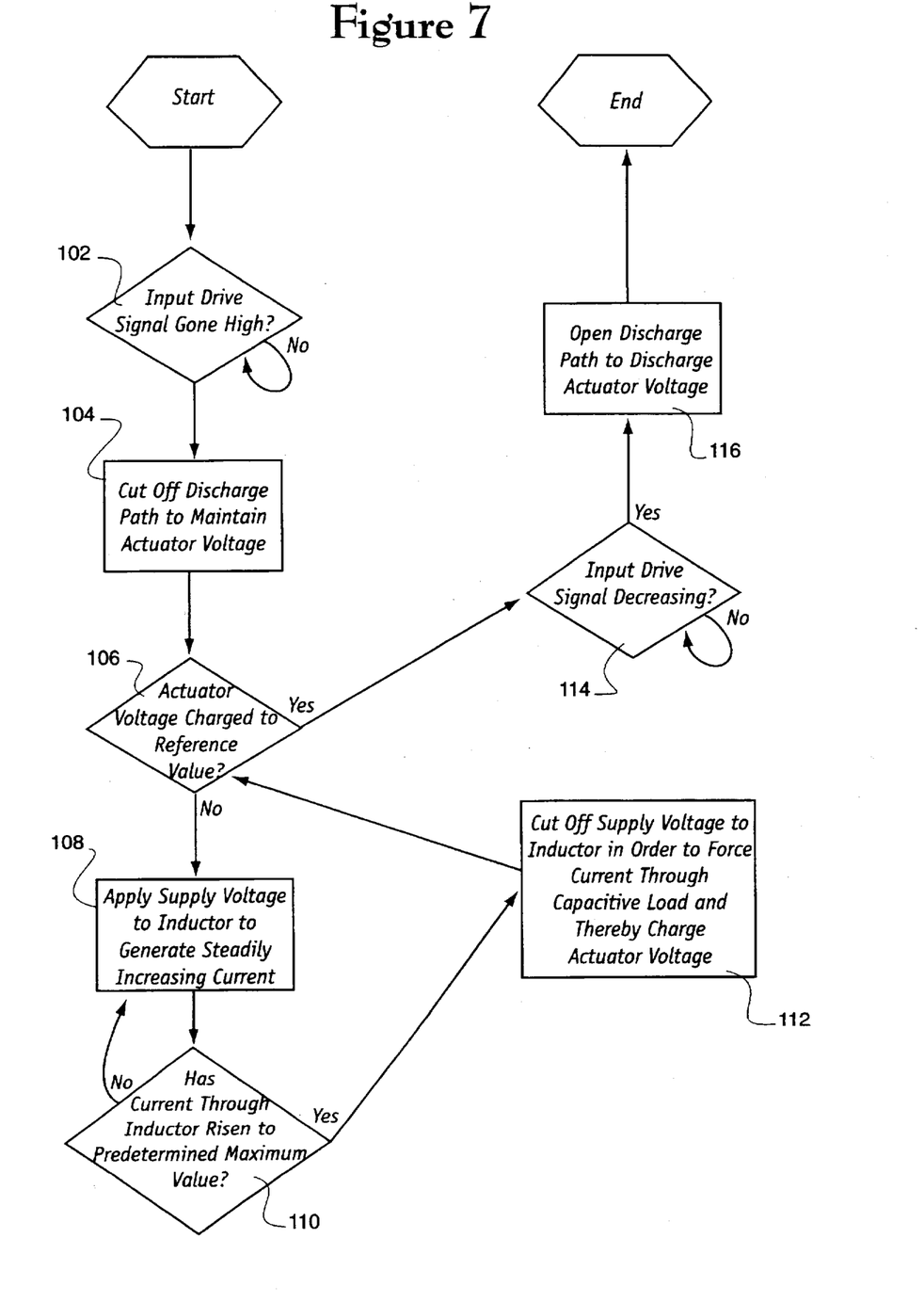
FIG. 7 is a flowchart diagram illustrating the method of driving a piezoelectric drive circuit according to the present invention.

FIG. 7 shows a flowchart that presents the method that is used to drive the piezoelectric circuit according to the present invention. This figure tracks one cycle of an input drive signal supplied to the piezoelectric drive circuit. The method described in this flowchart will be made clearer by referring to the waveforms depicted in FIG. 5. Referring now to FIG. 7, the system waits at step 102 for the applied input piezoelectric drive signal to go positive. Once the system detects a positive value of the input drive signal, the system cuts off a discharge path at step 104 so that any output voltage stored by the piezoelectric actuator is preserved. At step 106, the piezoelectric drive circuit determines whether the actuator voltage has been charged to a reference value. As previously described, this reference value is established using a potentiometer to generate a proportional value of the input signal. Upon determining that the actuator voltage has not yet been charged to the reference value, the piezoelectric drive circuit supplies a voltage to an inductor to generate a steadily increasing current through the inductor. At step 110, the system determines whether the current through the inductor has risen to a predetermined maximum value by checking a voltage drop associated with the current, and if so, the system cuts off the supply voltage to the inductor at step 112. Termination of the supply voltage at step 112 changes the circuit pathway such that the current generated through the inductor is forced to flow through a capacitive load in order to charge the actuator voltage. Steps 106, 108, 110 and 112 are repeated during the charging interval (see FIG. 5, time interval from $T_1$ to $T_2$) until the actuator voltage is charged to the reference value.

Once the actuator is fully charged, the system waits at step 114 for the applied input drive signal to make a negative transition (see FIG. 5, input drive signal 24 at time $T_3$) and decrease toward zero. Once the input drive signal begins to decrease, the system at step 116 opens the discharge path to allow the actuator voltage to discharge. It should be understood that this flowchart is presented as a model of the methodology associated with the piezoelectric drive circuit of the present invention. While the flowchart depicts the essential steps of the presented method, it should be understood that these steps may be re-ordered and combined with other steps as necessary.

It should be readily understood that the present invention is applicable where a controlled voltage is needed with an amplitude higher than the systems main power supply, with the controlled voltage applied to a capacitive load while minimizing power dissipation. An example would be battery operated systems that use miniature cathode-ray tubes with electrostatic deflection and focus. Such systems normally use 3 volt or 4.5 volt battery power, but require deflection voltages in the 30 to 50 volt range. Prior to the present invention, a power supply of a somewhat higher voltage would be employed with amplifiers converting low voltage waveforms into the required drive voltages. The present invention enables the necessary drive waveforms to be developed directly from the low voltage battery supply, with a significant reduction of power and space.

From the foregoing description of the drive circuit and the accompanying methodology it can be seen that the present invention provides an improved device and method for generating an output voltage that effects a precise displacement in a physical device. The drive circuit reduces overall power consumption by utilizing a low voltage power supply which may be shared by other subsystems, and through the use of low impedance and other reactive components to minimize power dissipation. The drive circuit also avoids losses by employing switching techniques that prevent current flowing when the output voltage is not to be charged. The low power requirements of the drive circuit allow it to be incorporated into portable devices which run on battery power. In addition to these power saving advantages, the drive circuit employs high, but limited currents to provide a quick response to drive control signals.

What is claimed is:

1. A drive circuit that utilizes a power supply to generate an output voltage that effects a precise displacement in a physical device, comprising:

storage circuitry including a diode, an inductor, and a capacitive load for storing the output voltage, said diode providing a unidirectional current path between the inductor and the capacitive load;

a supply switch connected between the storage circuitry and the power supply for providing a supply voltage from the power supply to the inductor;

control circuitry for controlling the supply switch in response to a plurality of signals including an input signal, a first feedback signal representing a time-varying current, and a second feedback signal representing the output voltage, such that the supply voltage is intermittently applied to the inductor for generating the time-varying current;

said diode preventing the time-varying current from flowing through the capacitive load when the supply voltage is applied to the inductor; and wherein the time-varying current that flows through the unidirectional current path into the capacitive load generates the output voltage that is used to effect the precise displacement in the physical device.

2. The drive circuit of claim 1, further comprising discharge circuitry connected to the storage circuitry and control circuitry, the discharge circuitry receiving a discharge control signal from the control circuitry that is used to change an impedance of a discharge path used by the storage circuitry to discharge the output voltage.

3. The drive circuit of claim 1, wherein the control circuitry controls the supply switch in response to the input signal for providing on-off control of the output voltage.

4. The drive circuit of claim 1, wherein the control circuitry further comprises a comparison circuit having a variable threshold, said variable threshold moving between a minimum value and a maximum value, said comparison circuit also having an output for operating the supply switch between an open state when the time-varying current rises above the maximum value, and a closed state when the time-varying current falls below the minimum value.

5. The drive circuit of claim 1, wherein the control circuitry controls the supply switch in response to the input signal for controlling the output voltage to proportionally track the input signal.

6. The drive circuit of claim 2, wherein the discharge circuitry includes a transistor connecting the capacitive load to a ground, the transistor receiving a saturating current when the input signal is decreasing in magnitude, the saturating current causing the transistor to form the discharge path.

7. The drive circuit of claim 1, wherein the supply switch includes a transistor connecting the power supply to the storage circuitry, the control circuitry supplying a saturating current to the transistor so that a conductive path is formed that allows the application of the supply voltage to the storage circuitry.

8. The drive circuit of claim 1, wherein the power supply is a low voltage power supply.

9. The drive circuit of claim 1, wherein the capacitive load is a component of a piezoelectric actuator.

10. The drive circuit of claim 1, wherein the capacitive load is a component of a cathode ray tube.

11. A method of using a supply voltage of a power supply to generate an output voltage that proportionally tracks an input signal to effect a precise displacement in a physical device, comprising the steps of:

providing a storage circuit having an inductor and a capacitive load;

using control circuitry to receive the input signal and a feedback signal that is representative of the output voltage;

generating a control signal with the control circuitry in response to the input signal and the feedback signal;

transmitting the control signal to a supply switch;

intermittently applying the supply voltage to the storage circuit with the supply switch in response to the control signal, such that a time-varying current through the inductor is generated; and storing energy supplied by the time-varying current in the capacitive load such that the output voltage generated proportionally tracks the input signal and thereby effects the precise displacement in the physical device.

12. The method of claim 11, further comprising the step of preventing the time-varying current from flowing through the capacitive load when the supply voltage is applied to the inductor; and terminating the application of the supply voltage to the inductor to force the time-varying current to flow through the capacitive load.

13. The method of claim 11, further comprising the steps of:

producing a scaled reference voltage that is representative of the input signal; and generating the control signal with the control circuitry in response to comparing the scaled reference voltage to the feedback signal such that the generated output voltage is proportional to the input signal.

14. The method of claim 11, further comprising the step of altering the impedance of a discharge path that connects the storage circuitry to a ground.

15. A drive circuit for generating an output voltage for effecting a precise displacement in a physical device, said circuit comprising:

a power supply for producing a supply voltage;

storage circuitry including an inductor, a diode, and a capacitive load for storing the output voltage, said diode providing a unidirectional current path between the inductor and the capacitive load;

a supply switch connected between the power supply and the storage circuitry for providing a supply voltage from the power supply to the inductor for generating a time-varying current;

control circuitry for controlling the supply switch in response to a plurality of signals including an input signal, an output of a comparison circuit, and a feedback signal representing the output voltage;

said comparison circuit having a variable threshold, said variable threshold moving between a minimum value and a maximum value, the output of said comparison circuit for operating the supply switch between an open state when the time-varying current rises above the maximum value, and a closed state when the time-varying current falls below the minimum value, such that the supply voltage is intermittently applied to the inductor for generating the time-varying current;

said control circuitry additionally controlling the supply switch in response to the input signal for controlling the output voltage to proportionally track the input signal;

said diode preventing the time-varying current from flowing through the capacitive load when the supply voltage is applied to the inductor;

wherein the time-varying current that flows through the unidirectional current path into the capacitive load generates the output voltage which effects the precise displacement in the physical device; and discharge circuitry for discharging the output voltage in response to a discharge control command.

16. The drive circuit of claim 15 wherein the discharge control command is initiated in response to the input signal.

* * * * *